United States Patent
Woodman, Jr.

[11] Patent Number: 5,832,048
[45] Date of Patent: Nov. 3, 1998

[54] DIGITAL PHASE-LOCK LOOP CONTROL SYSTEM

[75] Inventor: Gilbert R. Woodman, Jr., Santa Clara, Calif.

[73] Assignee: International Business Machines Corporation, Armonk, N.Y.

[21] Appl. No.: 563,352

[22] Filed: Nov. 28, 1995

Related U.S. Application Data

[63] Continuation of Ser. No. 175,584, Dec. 30, 1993, abandoned.

[51] Int. Cl.$^6$ ................................................ H03D 375/376
[52] U.S. Cl. .......................... 375/376; 375/371; 375/374; 375/375; 331/18; 331/25
[58] Field of Search ...................... 375/371, 373, 375/374, 360, 375, 376; 331/25, 1, 18; 327/159

[56] References Cited

U.S. PATENT DOCUMENTS

| | | | |
|---|---|---|---|
| 3,946,323 | 3/1976 | Bjerde | 328/63 |
| 4,686,560 | 8/1987 | Balaban et al. | 331/1 |
| 4,715,000 | 12/1987 | Premerlani | 364/484 |
| 4,715,050 | 12/1987 | Tanaka et al. | 375/111 |
| 4,862,485 | 8/1989 | Guinea et al. | 375/120 |
| 4,972,444 | 11/1990 | Melrose et al. | 375/120 |
| 4,975,930 | 12/1990 | Shaw | 375/120 |
| 5,056,054 | 10/1991 | Wong et al. | 364/724.01 |
| 5,057,794 | 10/1991 | Shih | 375/120 |
| 5,079,519 | 1/1992 | Ashby et al. | 331/1 A |
| 5,109,394 | 4/1992 | Hjerpe et al. | 375/119 |
| 5,111,151 | 5/1992 | Ii | 328/155 |
| 5,208,839 | 5/1993 | Hladik et al. | 375/376 |
| 5,272,730 | 12/1993 | Clark | 375/376 |
| 5,313,503 | 5/1994 | Jones et al. | 331/25 |
| 5,319,681 | 6/1994 | Meyer | 374/376 |
| 5,459,766 | 10/1995 | Huizer et al. | 375/373 |
| 5,507,794 | 4/1996 | Shih | 375/376 |

Primary Examiner—Wellington Chin
Assistant Examiner—Conguan Tran
Attorney, Agent, or Firm—Randy W. Lacasse; David J. Kappos; Noreen Krall

[57] ABSTRACT

A phase-locked loop implemented in all-digital components uses a stochastic approach to detect errors in phase position and relative velocity. Using a history circuit and an adjustment-intensity selection circuit appropriate corrections in phase and frequency are made. The history circuit keeps a running record of a series of binary results (0 or 1) as received from a phase comparator. History components collected include the number of consecutive oscillator periods in which the phase offset (0 or 1) has remained the same and the number of oscillator periods in which the phase offset count has not exceeded 1.

13 Claims, 3 Drawing Sheets

DIGITAL PHASE-LOCK LOOP CONTROL SYSTEM

This application is a continuation of application Ser. No. 08/175,584, filed Dec. 30, 1993, now abandoned.

BACKGROUND OF THE INVENTION

1. Field of Invention

The present invention is directed to a method and apparatus for implementing a phase-locked loop (PLL). More particularly the invention is directed to an all digital system for achieving a PLL function.

2. Discussion of Prior Art

Phase-locked loops, hereafter PLL, are traditionally used as a means to track a specifically desired signal within a specified frequency range. A typical prior art application of a PLL would be the FM tuner circuit in your car stereo system. As a user tunes the station to a desired frequency, a PLL circuit locks onto this desired frequency. The signal remains locked as long as fluctuations in frequency do not exceed some predetermined error range. When the signal falls outside this error range, the PLL will become unlocked and the signal will no longer be tuned.

A typical prior art PLL is comprised of three basic elements: a phase comparator, a low-pass filter and a voltage controlled oscillator (VCO)—see FIG. 1. The VCO operates at a frequency $f_0$ occurring when the voltage is zero and is varied within a range according to the applied voltage. The phase comparator (detector) produces an output signal which is a function of the difference between the input signal (reference frequency) and the VCO signal. The signal from the low-pass filter is used to adjust the voltage of the VCO to make frequency corrections as required.

It is often necessary in complex digital systems to use PLLs at the VLSI level for synchronization purposes. PLLs may be implemented either as an analog system (APLL) or as a digital system(DPLL). In the prior art, placement of Phase Lock Loop (PLL) functions on a VLSI chip has required some portion of the function to be implemented with analog supporting circuitry. FIG. 2 illustrates an example of such a system. In FIG. 2, an A/D conversion is necessary to implement an arithmetic FFT, the results of which are then converted back to analog data for the VCO. Analysis of the PLL closing/tracking behavior normally describes the system as being a type two servo, which requires an integration function for stability (i.e., an analog filter). Other forms of non-linear control systems have been applied to other less demanding tasks and are described as "bang-bang" or relay control systems. A thermostat is such a control system, and falls under the category of a droop regulator, that is, it has an error proportional to the load of driving the correction. The success of analysis of such prior art systems usually involves a form of "linearization" of these very non-linear activities to allow use of linear theories for solution.

As described above, because of the non-linearity of PLL's, they are at best conditionally stable systems. There is a need to be able to provide a closed analytic answer for its transient responses. Economies of scale and performance dictate that the PLL function should be implemented on a totally digital logic VLSI chip, eliminating the need for special analysis or testing during manufacture. The instant invention provides for an all digital implementation of a PLL, as will be described more completely, hereafter.

SUMMARY OF THE INVENTION

It is an object of this invention to implement a PLL function.

It is also an object of this invention to eliminate analog-to-digital (A/D) conversions and arithmetic processing as used in the prior art PLL circuitry.

It is further an object of this invention to use all digital elements to implement the PLL function.

It is further an object of this invention to use a stochastic approach eliminating the need for unbounded non-linear control information input.

There is provided, in accordance with the present invention, a phase-locked loop implemented in all-digital components. The system uses a stochastic approach using a history circuit and adjustment-intensity selection circuit. The history circuit keeps a running record of a series of binary results (0 or 1) as received from the phase comparator. The history components collected include the number of consecutive oscillator periods in which the phase offset (0 or 1) has remained the same (a low number means the phases are closely matched), and the number of oscillator periods in which the phase offset count has not exceeded 1, called the "good cycle count" (a high number indicates the phases are closely matched).

The history circuit drives the adjustment intensity selector, whose function is to choose an adjustment factor to apply to a digital-controlled-oscillator (DCO). The adjustment intensity selector provides two adjustments, one to correct phase offset and a second to correct frequency offset. If the good cycle count is high (for example, greater than 40) no correction is applied. If the good cycle count is mid-range (e.g. 20–40), only phase adjustment is applied. If the good cycle count is low, both phase and frequency are adjusted. In the case where both phase and frequency are adjusted, a ratio is selected to provide the desired damping effect. If overdamping is required, a low ratio of phase adjustments to frequency adjustments is used. If underdamping is required, a high ratio is used. In the preferred embodiment, slight under damping is achieved by providing 8 increments of phase adjustment for every 1 increment of frequency adjustment.

The adjustment intensity selector drives an up/down counter whose count determines the frequency output of the DCO. The dividers are optionally used for frequency scaling in cases where it is desired to provide the local oscillator at some multiple of the reference oscillator frequency. The management circuit handles rough frequency locking at system start-up.

DESCRIPTION OF THE PREFERRED EMBODIMENTS

This invention describes a stochastic behavior that permits closing a phase-lock loop with no information from a phase comparison other than a binary lead/lag indication.

The following detailed description describes an implementation of the preferred embodiment.

Figure 4:
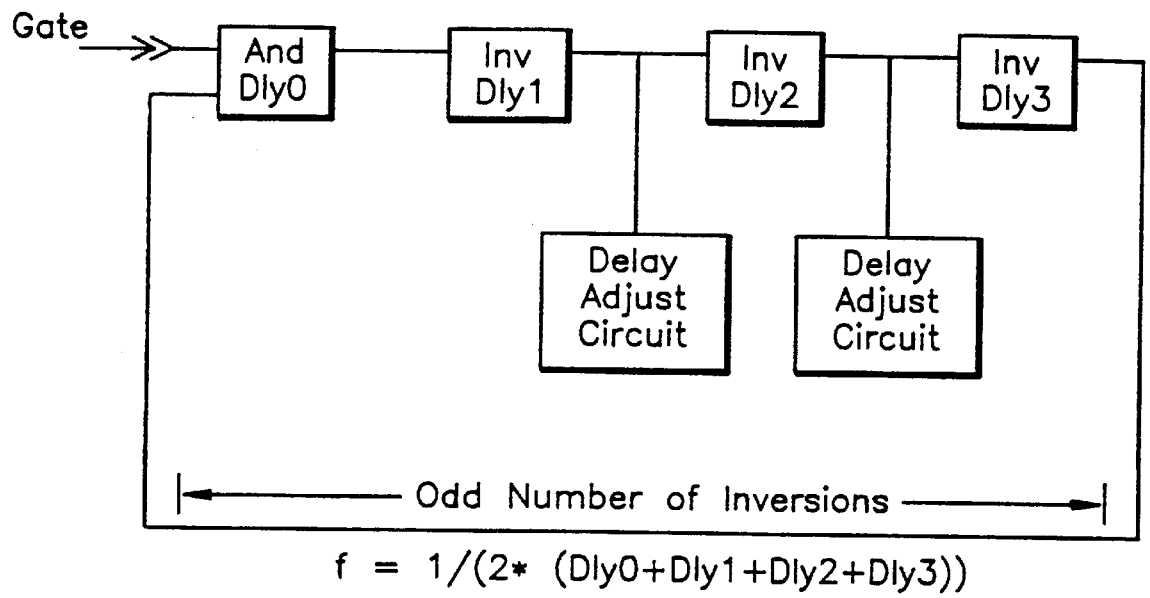
FIG. 4 illustrates an Adjustable Delay Oscillator.
Figure 6:
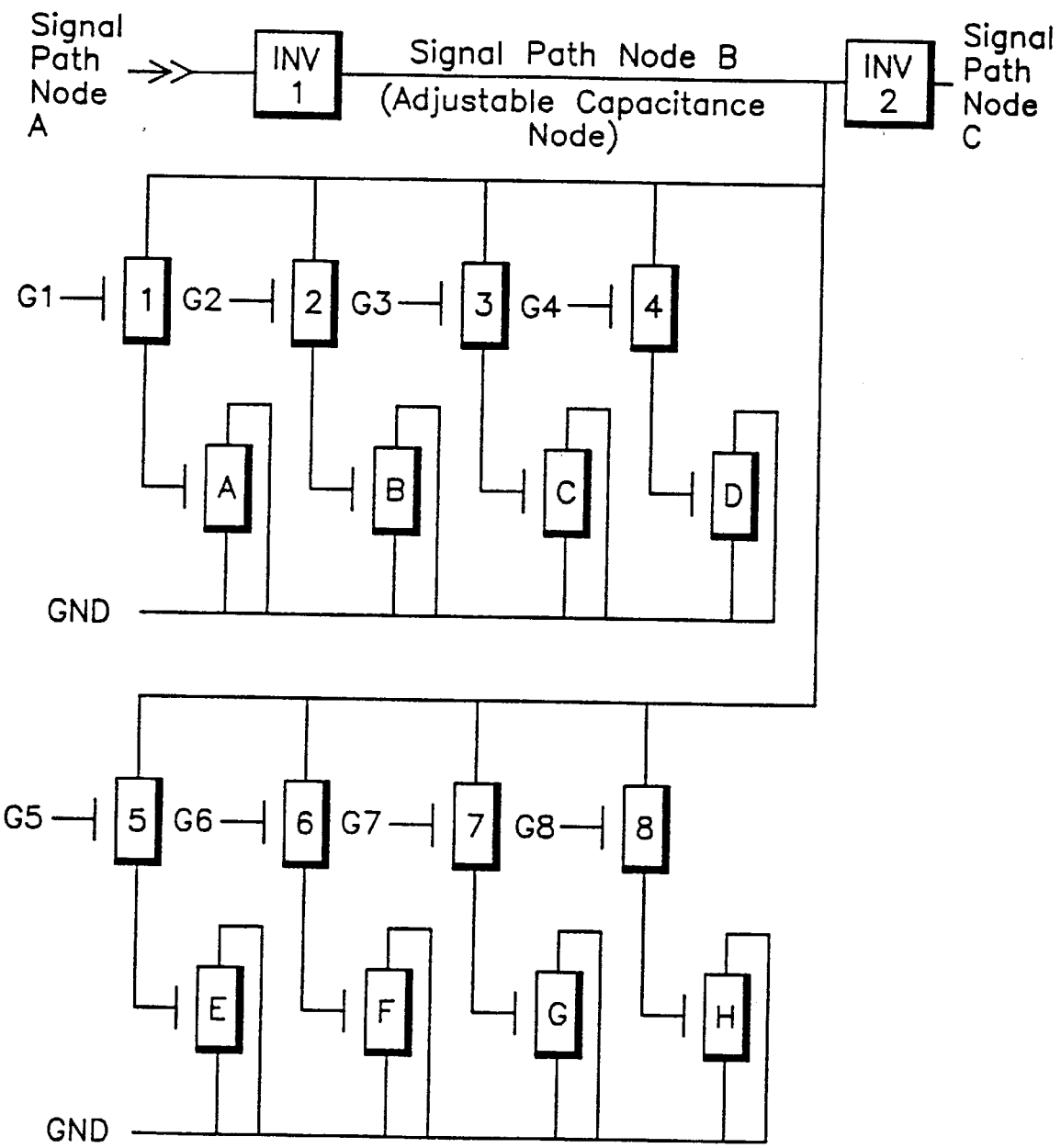
FIG. 6 shows an example of a CMOS Adjustable Delay Circuit structure.

Most digital or even "all digital" PLL implementations use a form of voltage controlled oscillator (VCO) as the variable controlled element to produce the desired product signal. In a VLSI logic only chip, such structures are not well supported. A conventional delay ring oscillator, FIG. 4, can be implemented in conventional logic circuits any time an odd number of inversions occur around a closed loop of logic. The frequency of operations can be adjusted by changing the capacitor load on stages of the inverters. The technology of switched capacitor load changing is a well documented practice. For such an oscillator, it is the analog behavior of the delay of the inverter that converts the digital switched information to the frequency of operation. Control of the switch can be done with any conceptual logic structure. The logic that defines the state of a multiple of these switches will be referred to as an up-down "Delay Counter". FIG. 6 illustrates a CMOS implementation of a digital delay circuit.

Figure 5:
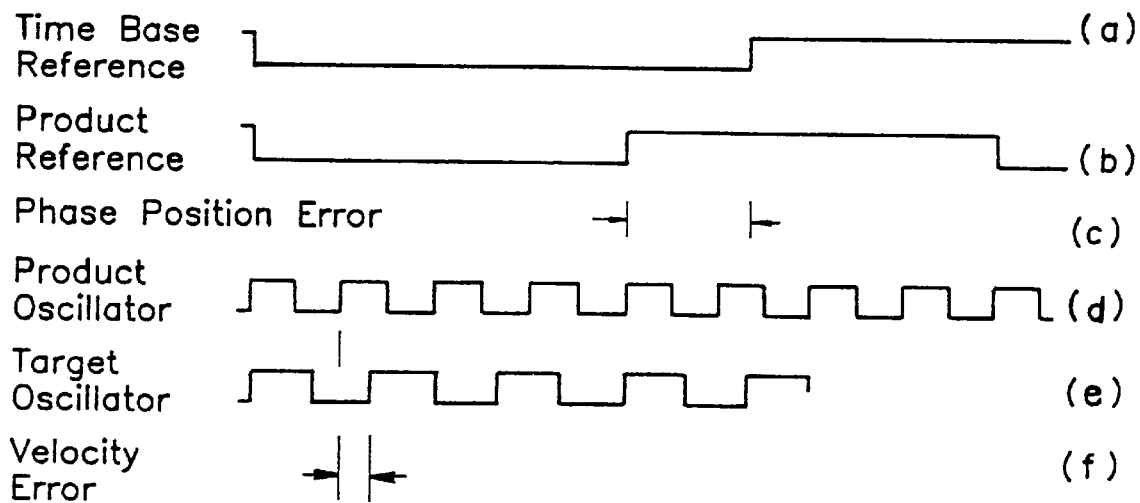
FIG. 5 provides for a Phase Comparison illustration of the PLL phase relationships.

FIG. 5 illustrates the time relationship of two signals that are to be phase locked. There may be some delta ($\Delta_1$) between the time location of the two signals and the desired "zero-phase error" location, hereafter "position error" (c). There also may be a delta ($\Delta_2$) between the size of the controlled oscillator signal (d) and its desired size (e), hereafter "velocity error" (f). This size difference will cause a motion of the measured position every cycle of phase measurement. Quite often a phase measurement will be made at some multiple of the controlled oscillator period and then the motion per measurement cycle will be that multiple times the velocity error. The signal to which phase lock activity is being measured will be referred to as the "Time Base Reference" (a). The signal which is a multiple of the product (controlled) oscillator will be referred to as the "product-reference".

Motion and velocity of the controlled oscillator signal, and thus of the "product reference", can be considered independently controllable elements. If one switch that controls an inverter's delay is moved for one half of the reference cycle, and restored for the other half, the position of the reference will have been translated in time relative to the "time base reference". If one switch is moved and left, the phase position will change every passing reference cycle, and thus the "velocity error" will have been changed.

It is easily demonstrated with a mathematical model that stability of a DPLL is influenced by the ratio of motion versus velocity changes that are imposed in the direction of correction of phase error. If the "delay counter" is simply moved the correction direction, one count per reference cycle, it is a velocity change only and the system will be unstable. By the time the phase relationship changes (crosses zero), the velocity error will be greater than the starting velocity error, with swings increasingly greater. If, however, there are 8 motion changes made for every one velocity change, then the phase position error will behave in a slightly underdamped manner, approach the zero phase error position, and enter a limit cycle around the zero position. If there are 16 motion changes per velocity change, the approach will be highly overdamped. The size of the limit cycle is determined by the intensity of action or vigor of control as defined by the size of the timing change. The vigor is increased by multiplying both motion and velocity changes keeping the ratio the same (i.e., 16::2, 32::4).

With this basic knowledge, we can define a procedure that eliminates the need to measure the time duration of a proportional phase comparator output, and yet adjusts the vigor of the error correction, and thus the size of the limit cycle, to that appropriate to the noise and slewing conditions.

A logic delay ring oscillator has an advantage of being made up of the same elements as the remainder of the circuits on the chip, and thus can be started and stopped under logic control, with very little time delay. This allows the initial matching of the length of the "product reference" to the "time base reference" by starting the "product oscillator" at the beginning of the "time base reference" and checking for phase indication at the end of the "product reference". A pattern of successive approximations or simply sequential tests will allow the finding of a close match in lengths. The product oscillator can thus be started with a very small residual position and velocity error, and eliminate the need for a four quadrant phase compare function or a need to numerically measure the time of the phase error signal as most prior art "digital" implementations do.

Given a small starting error, the criterion for phase capture is thus simplified insuring that the initial vigor of motion and velocity change is sufficient to override any possible noise and slew disturbance imposed at the start. Stability of the system is assured by keeping the ratio of motion to velocity at the 8 to 1 level and keeping the resultant velocity slew rate higher than the imposed disturbance. The goal for the tracking algorithm is to adjust the vigor of correction to the observed need, at a rate that will satisfy the application requirement for tracking precision.

A procedure to accomplish such, is to provide phase comparison latches (indicators) at fixed positions in time, on either side of the zero phase error position, and use them to time the intensity of the response. The distance from the zero to the trip point would have to be greater than the boundary of the corresponding limit cycle. This procedure requires precise placement in time of these trip point phase comparators, which on VLSI logic chips requires a calibration behavior.

Figure 1:
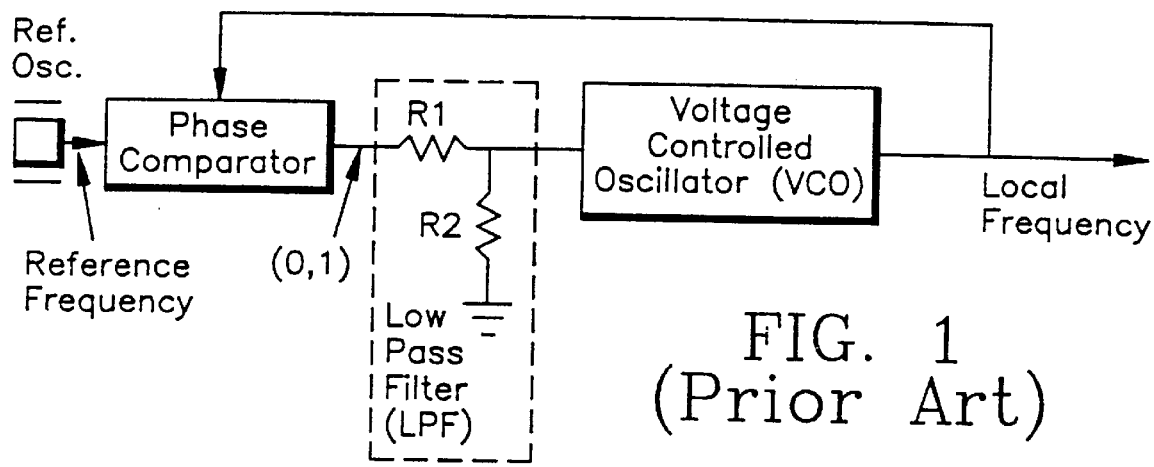
FIG. 1 provides for a block diagram of the prior art basic PLL circuit.
Figure 2:
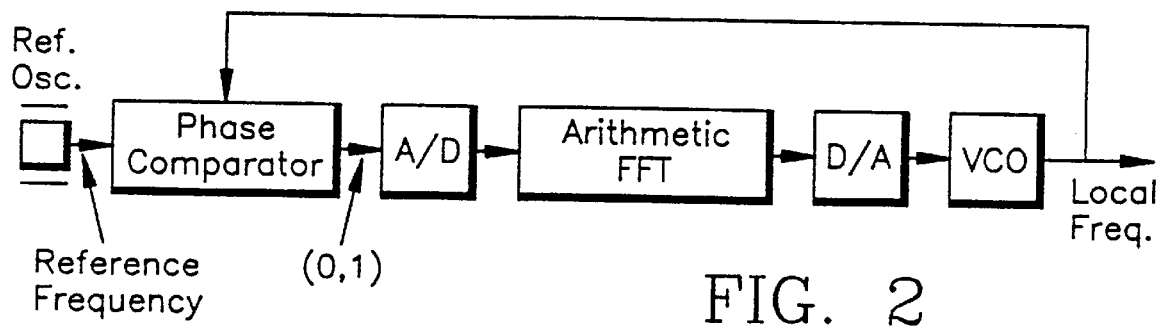
FIG. 2 illustrates a block diagram of a second technique of performing a PLL with analog/digital/analog processing.
Figure 3:
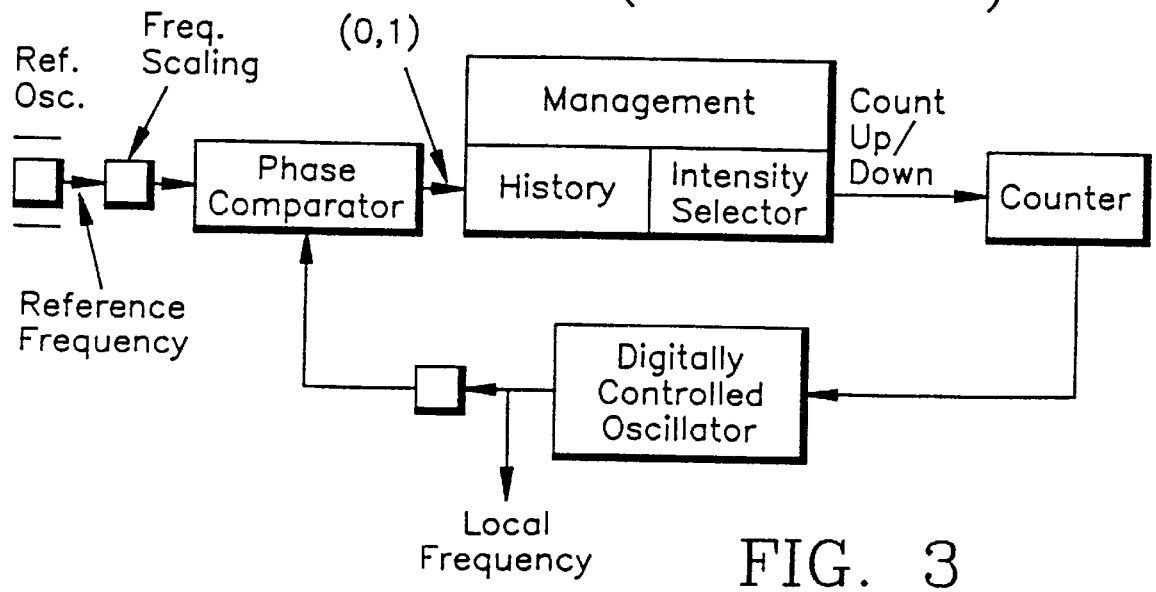
FIG. 3 illustrates the present PLL circuit of the instant invention.

FIG. 3 illustrates a block diagram of the preferred embodiment of the instant invention. The prior art VCO or adjustable delay oscillators have been replaced with a digitally controlled oscillator. The prior art low-pass filter or "arithmetic" FFTs have been replaced with a tracking system which comprises history intensity and counter functions. The DPLL provides for both frequency (velocity) and phase corrections (scaling). The particulars of the system will be discussed in detail below.

A tracking procedure that uses only the zero point phase comparator can be implemented by developing a short term history of the zero point phase reversals. This is demonstrated by assembling four elements of history:

A logic shift register which can recall the history of the last few phase compare samples—"Phase Compare Stack". The Phase Compare Stack identifies zero point crossings, and arm points for skipping motion (not causing a motion) at the minimum vigor setting.

A counter that counts the number of reference cycles between zero point crossing, and is reset upon zero crossing—"Phase Counter". The Phase Counter can provide trip points for accelerating the increase in intensity of correction when a slewing insult has been imposed on the function.

A counter that counts up to a limiting value if there have been less than two reference cycles since the last zero crossing and down to zero if there are more than two—"Good Cycle Counter" (GCC). The Good Cycle Counter provides direct control of the vigor or intensity of correction. (If GCC>8, use 8::1 correction, else use 32::4 correction).

A counter that is incremented if no zero crossing is made and is reset on zero crossing or reaching the value of seven—"Cycle Counter". It is practical to reduce the motion correction response below the critical 8::1 value by also reducing the velocity correction to fractional value by skipping cycles. Thus, a 4::1/2 can be implemented by only allowing one velocity correction every other 4 units of motion correction. This way a 2::1/4 and a 1::1/8 can be implemented as well, while maintaining the criterion for stability.

The listing below illustrates a complete simulation model of the tracking algorithm in a spread sheet equation form. The A section displays the sequential phase position error. The B section is the residual velocity error at the end of a reference cycle. The S section is the velocity error during the motion correction portion of the reference cycle. Simulation results indicate very stiff response to disturbance of the velocity error that could be imposed on such a delay ring oscillator by voltage or temperature variations while in operation.

```
                Single Phase Comparator Control Algorithm
        Cycles per Reference               40    ($CYCLES)
        Step Size                          0.004 ($STEP)
        Oscillator Period                  10    ($PERIOD)
        Reference Period                   400   ($CYCLES*$PERIOD)
        Starting Position Error            2     ($STPOS)
        Starting Velocity Error            0.125 ($STVEL)
        Slewing Velocity Factor            0.00001 ($SLEWRATE)
        Noise Magnitude                    0.125 ($NOISE)

A12:   'Position
        A13:   ' Error
        A14:   (STPOS)
        A15:   +A14+E14

B12:   'Velocity
        B13:   ' Error
        B14:   (STVEL)
        B15:   +B14+D15+($SLEWRATE)

C13:   '   Mode
        C14:   32
        C15:   @IF(O15=0,32,@IF(P15=0,8,@IF(Q15=0.4.@IF((((G12=G13)#AND#
               (G13=G14)#AND#(G14<>G15)#AND#(N14<>1)#OR#(C14=0#AND#L13>5))
               #OR#(C13=0#AND#G13<>G14#AND#G14<>G15),0,@IF(R15=1,1,3)))))
```

14

```
   D12:  'Velocity
   D13:  '  Delta
   D14:  (-$STEP*G14*(@IF(O14=0,4,(@IF(P14=0,1,(@IF(N14=1,1,0)))))))
   D15:  (-$STEP*G15*(@IF(O15=0,4,(@IF(P15=0,1(@IF(N15=1,1,0)))))))

E12:  'Position
   E13:  '  Delta
   E14:  ((B14*$CYCLES)=F14)
   E15:  ((B15*$CYCLES)=F15)

F12:  'Relative
   F13:  'Motion
   F14:  -($STEP*($CYCLES/2)*G14*C14)
   F15:  -($STEP*($CYCLES/2)*G15*C15)

G12:  'Phase
   G13:  'Compare
   G14:  (H14/@ABS(H14))
   G15:  (H15/@ABS(H15))

H12:  'Sampled
   H13:  'Position
   H14:  +A14+I14
   H15:  +A15+I15

I12:  'Random
```

```
     I13:   '  Noise
     I14:   ($NOISE*(0.5-@RAND))
     I15:   ($NOISE*(0.5-@RAND))

    J12:   '  Cycle
     J13:   '  Counter
     J14:   0
     J15:   @IF(G15<>G14,0,@IF(J14=7,0,J14+1))

     K13:   'Cntl Zn
     K14:   @IF((L14>2),0,1)
     K15:   @IF((L15>2),0,1)

L12:   '  Phase
     L13:   '  Counter
     L14:   0
     L15:   @IF(G14=G15,(L14+1),0)

     M12:   'Good Cycle
     M13:   '  Counter
     M14:   0
     M15:   @IF(P14=1#AND#L15>#AND#M14>20,20,@IF((K15=0),@IF(M14=0,0,
            M14-1),@IF(M14=40,40,M14+1)))
     N12:   '  Velocity
```

```
N13:    '   Switch
N14:    (0)
N15:    @IF(Q15=0,@IF(G15=G14#AND#(J15=1#OR#J15=3#OR#J15=5#OR#J15=7),
        1,0),@IF(R15=0,@IF(J15=5#OR#J15=7,1,0),0))

O12:    '   32 Mode
O13:    '   Switch
O14:    0
O15:    @IF(M15>8,1,0)

P12:    '   32 Mode
P13:    '   Switch
P14:    (0)
P15:    @IF(M15>16,1,0)

Q12:    '   4 Mode
Q13:    '   Switch
Q14:    (0)
Q15:    @IF(M15>26,1,0)

R12:    '   2 Mode
R13:    '   Switch
R14:    (0)
R15:    @IF(M15>39),@IF(R14=1,1,@IF(G13<>G14#AND#G14<>G15,1,0)),0)

S12:    '   Velocity
```

17

```
S13:  '  Error
S14:  +B14+(F14/$CYCLES)
S15:  +B15+(F15/$CYCLES)
```

CONCLUSION

A system and method has been shown in the above embodiments for the effective implementation of an all digital Phase-Locked Loop function including elimination of conventional non-linear elements necessary for obtaining correction factors. While various preferred embodiments have been shown and described, it will be understood that there is no intent to limit the invention by such disclosure, but rather it, is intended to cover all modifications and alternate constructions falling within the spirit and scope of the invention as defined in the appended claims.

I claim:

1. A digital phase-locked loop device to control a reference signal comprising:
    means for initializing frequency locking of said reference signal during system start-up to establish starting phase and starting frequency error values;
    a phase comparator for detecting errors in said reference signal, said errors occurring after said starting phase and frequency error values have been established, and providing binary indications thereof;
    a first counting means for tracking said binary indications from said phase comparator and providing a first output indicative of phase error of consecutive oscillator periods and a second output based on said first output indicating the number of consecutive oscillator cycles in which no phase errors exist;
    an intensity selector for selecting an adjustment of said reference signal comprising a ratio of phase error to velocity error based on said second output, and
    a second counting means receiving said adjustment and outputting a desired frequency to a digitally-controlled-oscillator wherein said digitally-controlled-oscillator is connected back to said phase comparator thereby forming a feedback path.

2. A digital phase-locked loop device as per claim 1, wherein no adjustment is made based on a relatively large second output.

3. A digital phase-locked loop device as per claim 1, wherein said adjustment corrects both phase offset and frequency based on a relatively low second output.

4. A digital phase-locked loop device as per claim 3, wherein said adjustment is a ratio of phase offset and frequency corrections.

5. A digital phase-locked loop device as per claim 4, wherein said ratio is 8:1.

6. A digital phase-locked loop device to control a reference signal comprising:
    a phase detector to detect errors in said reference signal;
    means for initializing frequency locking of said reference signal during system start-up to establish starting phase and starting frequency error values;
    a history circuit tracking errors occurring after said starting phase and frequency error values have been established, and providing an output indicative of error in said reference signal;
    an intensity selector for selecting an adjustment factor for said reference signal, said adjustment factor comprising a ratio of phase error to velocity error;
    an up/down counter to supply a frequency value to a digitally-controlled-oscillator, and
    wherein said intensity selector with said output from said history circuit controls said digitally-controlled-oscillator to variably adjust said reference signal for phase and/or frequency corrections wherein said digitally-controlled-oscillator is connected back to said phase comparator thereby forming a feedback path.

7. A digital phase-locked loop device as per claim 6, wherein
    said history circuit tracks first binary indications of phase error of consecutive oscillator periods.

8. A digital phase-locked loop device as per claim 7, wherein said history circuit further tracks second binary indications of the number of oscillator cycles in which no phase errors exist.

9. A digital phase-locked loop device as per claim 7, wherein said adjustment factor is based on a relative value of said second binary indications.

10. A digital phase-locked loop device to control a reference signal comprising:
    means for initializing frequency locking of said reference signal during system start-up to establish starting phase and starting frequency error values;
    a phase comparator for detecting errors in said reference signal, said errors occurring after said starting phase and frequency error values have been established;
    a history circuit for receiving said errors from said phase comparator and providing a first count output indicative of phase error of consecutive oscillator periods as well as a second count output indicative of the number of oscillator cycles in which no phase errors exists;
    an intensity selector for selecting an adjustment factor for said reference signal based on said output of said history circuit indicating the number of oscillator cycles in which no phase errors exist, said adjustment factor comprising a ratio of phase error to velocity error;
    an up/down counter;
    a digitally-controlled-oscillator, and
    wherein said up/down counter receives said adjustment factor and outputs a correction to said digitally-controlled-oscillator to variably adjust said reference signal for phase and/or frequency, wherein said digitally-controlled-oscillator is connected back to said phase comparator thereby forming a feedback path.

11. A digital phase-locked loop device as per claim 10, wherein a relatively low first count value indicates that said phase error is small.

12. A digital phase-locked loop device as per claim 10, wherein a relatively high second count value indicates that the phases are closely matched.

13. A digital phase-locked loop device as per claim 10, wherein said ratio is 8:1.

* * * * *

UNITED STATES PATENT AND TRADEMARK OFFICE
CERTIFICATE OF CORRECTION

PATENT NO. : 5,832,048
DATED : November 3, 1998
INVENTOR(S) : Gilbert R. Woodman, Jr.

It is certified that error appears in the above-identified patent and that said Letters Patent is hereby corrected as shown below:

<u>IN THE DESCRIPTION OF THE PREFERRED EMBODIMENTS</u>

Column 3, lines 33, 34, replace " "Time Base Reference" " with - - "time base reference" - -.

Signed and Sealed this

Twenty-third Day of February, 1999

Attest:

Attesting Officer

Q. TODD DICKINSON

Acting Commissioner of Patents and Trademarks